United States Patent [19]

Marshall

[11] 4,418,297

[45] Nov. 29, 1983

[54] OSCILLATORY RESONANT TRANSDUCER DRIVER CIRCUIT

[75] Inventor: Patrick J. Marshall, Jefferson Lake, N.J.

[73] Assignee: L & R Manufacturing Company, Kearny, N.J.

[21] Appl. No.: 485,383

[22] Filed: Apr. 20, 1983

Related U.S. Application Data

[63] Continuation of Ser. No. 243,893, Mar. 16, 1981.

[51] Int. Cl.[3] .......... H01L 41/08

[52] U.S. Cl. .......... 310/316

[58] Field of Search .......... 310/314, 316, 317, 26; 318/116, 118

[56] References Cited

U.S. PATENT DOCUMENTS

| | | | |
|---|---|---|---|
| 3,318,578 | 5/1967 | Branson | 310/316 X |
| 3,432,691 | 3/1969 | Shoh | 310/316 |
| 3,526,792 | 9/1970 | Shoh | 310/316 |
| 3,651,352 | 3/1972 | Puskas | 310/316 |
| 4,081,706 | 3/1978 | Edelson | 310/316 |
| 4,141,608 | 2/1979 | Breining et al. | 310/316 |

*Primary Examiner*—Mark O. Budd

*Attorney, Agent, or Firm*—Lerner, David, Littenberg, Krumholz & Mentlik

[57] ABSTRACT

A transducer driver circuit is disclosed in which a pair of transistors and a pair of transformers are connected together to drive an ultrasonic cleaning apparatus.

4 Claims, 2 Drawing Figures

OSCILLATORY RESONANT TRANSDUCER DRIVER CIRCUIT

This is a continuation of application Ser. No. 243,893 filed Mar. 16, 1981.

FIELD OF THE INVENTION

This invention relates to resonant transducer drive circuits, and particularly to oscillatory resonant transducer circuits.

BACKGROUND OF THE INVENTION

Ultrasonic transducers require circuits for driving the same. The efficiency of an ultrasonic transducer system is, to a large extent, determined by the configuration of the drive circuit.

In U.S. Pat. No. 4,141,608, entitled "Circuitry for Driving a Non-linear Transducer for Ultrasonic Cleaning" which issued Feb. 27, 1979 to Breining, et al. and assigned to the assignee of the instant invention, it is taught that the power dissipation in the drive circuitry for an ultrasonic transducer can be reduced by providing a square wave driving signal to a resonant circuit including the ultrasonic transducer. In the circuit disclosed therein, however, the square wave is generated by a square wave generator having a frequency independent of the resonant characteristics of the ultrasonic transducer load circuitry so that the phase between the current and voltage in the drive circuitry is not controlled thereby.

In U.S. Pat. No. 3,651,352, entitled "Oscillatory Circuits for Ultrasonic Cleaning Apparatus" which issued Mar. 21, 1972 to William L. Puskas, an oscillatory circuit is disclosed for driving an ultrasonic transducer load circuit. In this circuit, a pair of resonant circuits is employed. This patent teaches that the resonant frequency of the resonant circuit connected to the drive circuitry should be a multiple even integer of the resonant frequency of the crystal transducer being driven. Thus, the current at the switching time of the transistor is not at its maximum value. In this circuit, the degree to which the current can be minimized at the switching time is dependent upon the accuracy to which the two resonant circuits can be made to be even multiples of each other and, further, even if this could be done perfectly accurately, the current value would not be zero at the switching time.

An article appeared at pages 33 through 38 in the summer, 1980 edition of R. F. Design, entitled "Class E Switching-Mode RF Power Amplifiers", which discusses the advantages of having the voltage and current transitions occur at different times in switching amplifiers to minimize power dissipation. This article also teaches that the voltage across the transistor at turn-on time should be the saturation voltage and that the slope of the transistor voltage at turn-on time should be zero. This article, however, does not teach an oscillatory driver circuit for an ultrasonic transducer, particularly one in which the current is zero at the switching time of the drive transistors.

BRIEF DESCRIPTION OF THE INVENTION

To overcome the disadvantages of the prior art, the present invention contemplates a circuit in which a pair of signal responsive switches having an output is connected to a resonant load circuit including an ultrasonic transducer by a first transformer having a primary winding and a secondary winding. A second transformer is connected in series with the resonant load circuit and the secondary winding of the first transformer. The secondary windings of the second current transformer drives the signal responsive switches so that the phase of the current in the signal responsive switches determines the switching time thereof. In this way, it can be assured that the switching time of the signal responsive switch coincides with the zero-crossings of the current through the switch. This substantially reduces the power dissipation in the signal responsive switch, therefore providing a highly efficient drive circuit.

DESCRIPTION OF THE DRAWINGS

For a more complete understanding of the invention, reference is being made to the following detailed description and drawings in which.

DETAILED DESCRIPTION OF THE INVENTION

Figure 1:
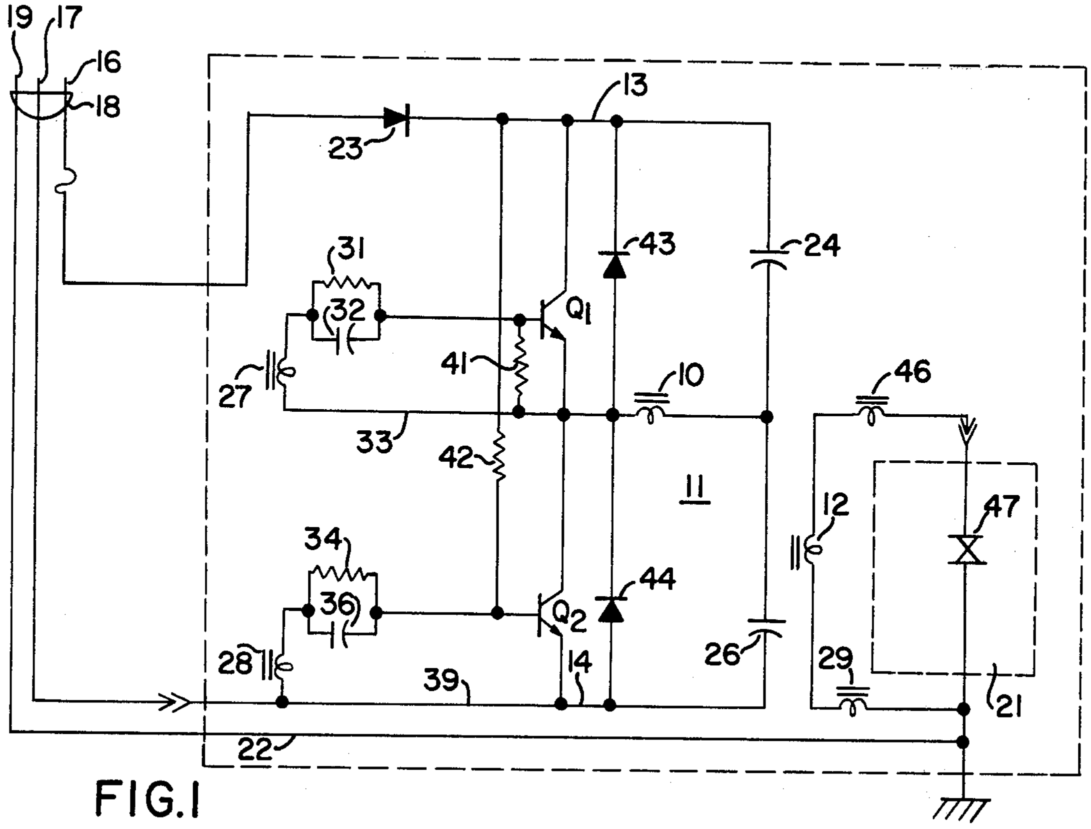
FIG. 1 is a schematic of a circuit embodying the principles of this invention.

Referring now to FIG. 1, we see a circuit incorporating the principles of this invention. The circuit includes a pair of transistors, $Q_1$ and $Q_2$, each having a collector, base and emitter. The emitter of $Q_1$ is connected to the collector of $Q_2$ to provide an output junction to drive the primary winding 10 of a transformer path for the primary 10 is provided by a pair of capacitors 24 and 26. The transistors $Q_1$ and $Q_2$ are connected in series between power leads 13 and 14. Power is supplied to the leads 13 and 14 via pins 16 and 17 of a plug 18. Pin 19 of plug 18 supplies a common return to a tank circuit 21 via lead 22. The voltage between the pins 16 and 17 is rectified by diode 23 and smoothed at high frequency by the capacitors 24 and 26. Base drive is provided to the transistors $Q_1$ and $Q_2$ via secondary windings 27 and 28, respectively, of a transformer having a primary winding 29. The secondary winding 27 is connected to the transistor $Q_1$ via resistor 31, capacitor 32 and lead 33. In a like manner, the secondary winding 28 is connected to the transistor $Q_2$ via resistor 34, capacitor 36 and lead 39. A resistor 41 is connected between the base of the transistor $Q_1$ and its emitter to bias transistor $Q_1$ to a normally off condition while a resistor 42 is connected between the base of transistor $Q_2$ and power lead 13 to bias the transistor $Q_2$ to a normally on condition so that $Q_2$ comes on at power start-up. Diodes 43 and 44 are connected across the transistors $Q_1$ and $Q_2$, respectively, to protect those transistors as is conventional. It should be understood that speed-up capacitors and baker clamps can be employed in conjunction with the turn-on and turn-off of the transistors $Q_1$ and $Q_2$ if necessary based upon the frequency of operation and the switching times of the various circuits.

The secondary winding 12 of the transformer 11 and the primary winding 29 of the transformer having secondary windings 27 and 28 are connected in series with each other and with an inductor 46 and an ultrasonic transducer 47 to provide a resonant circuit transformer coupled to the circuitry including $Q_1$ and $Q_2$ but d.c. isolated therefrom. Both the transformers 11 and the one formed by primary winding 29 and secondary windings 27 and 28 are current transformers.

In operation, when the circuit in FIG. 1 is energized, the transistor $Q_1$ is non-conductive as a result of the bias of resistor 41 while transistor $Q_2$ is rendered conductive by current supplied through resistor 42. This energizes primary winding 10 of transformer 11 which provides a signal across secondary winding 12 of the transformer 11 which follows the current through the primary winding 10. This voltage induces a current around the loop including the inductor 46, the ultrasonic transducer 47 and through the primary winding 29 which is sinusoidal in nature. The current passing through the primary winding 29 induces a voltage in the secondary windings 27 and 28, representative of the current through the primary winding 29 and having a sense determined by the dots on the transformer.

Since the impedance seen by the secondary winding 12 is reflected back to the primary winding 10 a half-sinusoid of current flows therethrough determined by the resonant frequency of the circuit consisting of the transformer windings 12 and 29, the inductor 46 and the ultrasonic transducer 47. At the resonant frequency of the circuit, the phase between the current and voltage in the primary winding 10 is zero.

Figure 2:
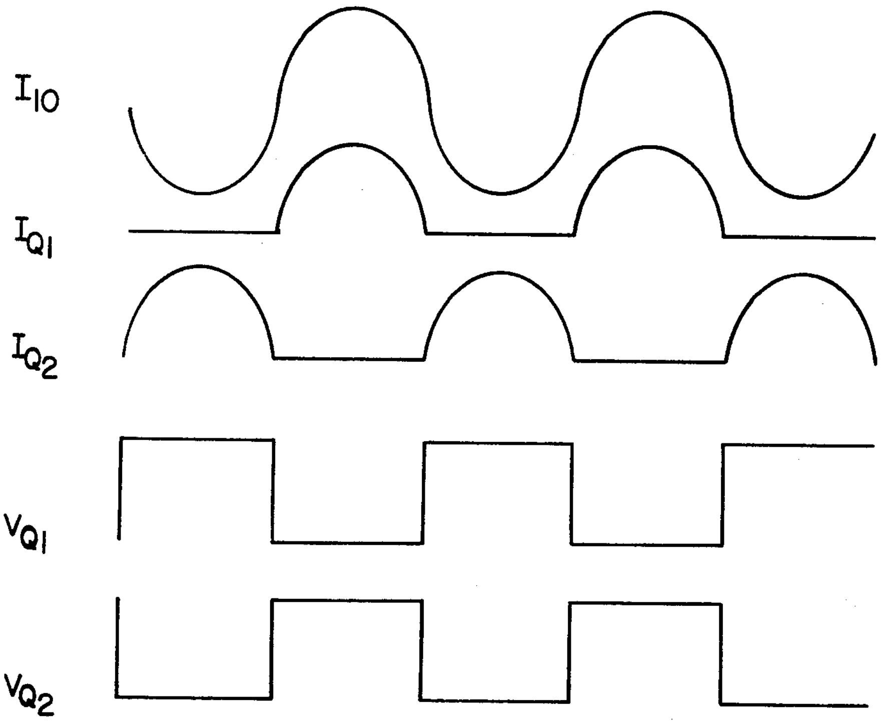
FIG. 2 is a diagram showing the current and voltage wave forms through the transistors $Q_1$ and $Q_2$ in the circuit of FIG. 1.

Referring to both FIGS. 1 and 2, we see that when $Q_2$ conducts, the voltage thereacross ($V_{Q2}$) drops to saturation while the current therethrough ($I_{Q2}$) builds up therethrough as a half-sinusoid. The voltage across $Q_1$ ($V_{Q1}$) is essentially the full power supply voltage across the leads 13 and 14 but the current therethrough ($I_{Q1}$) is zero. The current wave form $I_{Q2}$ induces a voltage across the secondary winding 12 which results in a current flowing therethrough which is fed back via primary winding 29 to secondary winding 28 to turn off $Q_2$ when the current therethrough passes through zero. Secondary winding 27 turns on $Q_1$ at the same time. It should be noted that the feedback is such that the switching time of the transistors $Q_1$ and $Q_2$ are precisely locked in phase with the current wave form in the transistors $Q_1$ and $Q_2$. In this way, the switching is made to occur at the zero-crossing of the current wave form in $Q_2$ and, as seen in the next cycle, the reverse switching occurs at the zero-crossing of the current wave form in $Q_1$. Thus, this invention provides a linear oscillator which includes in the feedback loop a pair of switching transistors whose switching time is controlled by the linear oscillatory wave form.

It should be understood that in prior switching circuits, the current was not zero and that power dissipation occurred in the transistors $Q_1$ and $Q_2$ during the switching transients based upon the average voltage and current during the switching transients for a time equivalent to the switching time of the transistors $Q_1$ and $Q_2$.

It should be noted that in the circuit of this invention, the frequency of operation of the circuit is determined by one resonant circuit which includes the transducer 47 and inductor 46 and that the phase of the switching between the current and voltage of the transistors $Q_1$ and $Q_2$ are precisely controlled because the voltage is switched based upon a signal proportional to the current flowing in such transistors. It should be noted that changes in temperature and other effects which may vary the resonant frequency of the circuitry, while effecting phase relationships between voltage and current in various parts of the circuitry, would not effect the phase relationship between the switching time of the current and voltage in the transistors $Q_1$ and $Q_2$ because of the novel circuitry of this invention. As a result, a highly efficient circuit has been provided for driving an ultrasonic transducer which insures that the current flowing through the transistors is at zero when the voltage switching occurs.

As a result of the circuitry as thus described, this circuit can be made to operate off various line voltages by merely changing the ratio of the windings of the transformer 11 without effecting other parameters of this circuit.

While this invention has been described with respect to particular embodiments thereof, numerous others have become obvious to those of ordinary skill in the art in light thereof.

What is claimed is:

1. In combination:

first and second signal responsive switches connected in series and provided with an output at the junction thereof;

a resonant load circuit including at least crystal transducer means connected to said output and driven by said first and second signal responsive switches, said crystal transducer means exhibiting changes in reactance as a function of temperature, age and load and said resonant load circuit manifesting resonant characteristics including a changing resonant frequency over a sufficiently wide frequency range to accommodate said changes in reactance of said crystal transducer means; and means for feeding back a signal associated with said resonant load circuit to alternately switch said first and second signal responsive switches, said means for feeding back maintaining a constant phase relationship between current and voltage over said range of frequencies and alternately switching said first and second signal responsive switches at substantially zero-crossover locations for reflected load current and current through said first and second signal responsive switches throughout said range of frequencies and substantially at any resonant frequency assumed within said range to achieve minimum power dissipation in said first and second signal responsive switches.

2. The combination as defined in claim 1 in which said feedback means include a first transformer having a primary winding and a secondary winding; said primary winding being driven by said output;

a second transformer having a primary winding and a pair of secondary windings; said primary winding of said second transformer being in series with said second winding of said first transformer each other and with said resonant load circuit; and said secondary windings of said second transformer driving said first and second signal responsive switches.

3. The combination as defined in either of claims 1 and 2 in which said said crystal transducer means comprises an ultrasonic transducer.

4. The combination as defined in claim 2 in which said crystal transducer means comprises an ultrasonic transducer.

* * * * *

UNITED STATES PATENT AND TRADEMARK OFFICE

CERTIFICATE OF CORRECTION

PATENT NO. : 4,418,297

DATED : November 29, 1983

INVENTOR(S) : Patrick J. Marshall

It is certified that error appears in the above-identified patent and that said Letters Patent are hereby corrected as shown below:

Column 1, line 50, "R.F. Design" should read --R.F. Design--.

Column 2, line 32, after "transformer" insert --11 which also has a secondary winding 12. The a.c. return--.

Column 4, line 54, delete "each other".

Column 4, lines 59-60, "either of Claims 1 and 2" should read --Claim 1--.

Signed and Sealed this

*Twenty-first* Day of *August 1984*

[SEAL]

*Attest:*

GERALD J. MOSSINGHOFF

*Attesting Officer* *Commissioner of Patents and Trademarks*